(12) United States Patent
Yudanov

(10) Patent No.: US 11,947,967 B2
(45) Date of Patent: *Apr. 2, 2024

(54) RECONFIGURABLE PROCESSING-IN-MEMORY LOGIC USING LOOK-UP TABLES

(71) Applicant: Lodestar Licensing Group LLC, Evanston, IL (US)

(72) Inventor: Dmitri Yudanov, Rancho Cordova, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/878,609

(22) Filed: Aug. 1, 2022

(65) Prior Publication Data
US 2023/0010540 A1   Jan. 12, 2023

Related U.S. Application Data

(63) Continuation of application No. 16/932,524, filed on Jul. 17, 2020, now Pat. No. 11,403,111.

(51) Int. Cl.
| | | |
|---|---|---|
| G06F 9/38 | (2018.01) | |
| G06F 9/30 | (2018.01) | |
| G06F 15/78 | (2006.01) | |
| G06F 15/80 | (2006.01) | |
| G11C 11/408 | (2006.01) | |
| G11C 11/4091 | (2006.01) | |

(52) U.S. Cl.
CPC ........ *G06F 9/3887* (2013.01); *G06F 9/30145* (2013.01); *G06F 9/3853* (2013.01); *G06F 15/7807* (2013.01); *G06F 15/8046* (2013.01); *G11C 11/4085* (2013.01); *G11C 11/4091* (2013.01)

(58) Field of Classification Search
None
See application file for complete search history.

(56) References Cited

U.S. PATENT DOCUMENTS

| | | | | |
|---|---|---|---|---|
| 7,506,135 | B1 * | 3/2009 | Mimar | ................. G06F 9/3004 712/7 |
| 7,584,343 | B2 | 9/2009 | Kirsch | |
| 9,940,995 | B1 * | 4/2018 | Chandler | ......... H03K 19/17728 |

(Continued)

FOREIGN PATENT DOCUMENTS

| | | |
|---|---|---|
| CN | 101291202 | 10/2008 |
| CN | 103823831 | 5/2014 |

(Continued)

OTHER PUBLICATIONS

USPTO, Office Action for U.S. Appl. No. 17/752,430, dated Dec. 15, 2022.

(Continued)

*Primary Examiner* — Eric Coleman

(57) ABSTRACT

An example system implementing a processing-in-memory pipeline includes: a memory array to store a plurality of look-up tables (LUTs) and data; a control block coupled to the memory array, the control block to control a computational pipeline by activating one or more LUTs of the plurality of LUTs; and a logic array coupled to the memory array and the control block, the logic array to perform, based on control inputs received from the control block, logic operations on the activated LUTs and the data.

20 Claims, 8 Drawing Sheets

(56) References Cited

U.S. PATENT DOCUMENTS

| | | |
|---|---|---|
| 10,410,690 B1 | 9/2019 | Chang |
| 10,862,485 B1* | 12/2020 | Jarboe .................. G06F 15/8053 |
| 11,354,134 B1 | 6/2022 | Yudanov |
| 11,355,170 B1 | 6/2022 | Yudanov |
| 11,403,111 B2 | 8/2022 | Yudanov |
| 2008/0180450 A1 | 7/2008 | Dowling |
| 2009/0024826 A1 | 1/2009 | Zhang et al. |
| 2009/0207642 A1 | 8/2009 | Shimano et al. |
| 2010/0046306 A1 | 2/2010 | Takahashi |
| 2010/0198893 A1* | 8/2010 | Azadet .................... G06F 7/556 708/517 |
| 2010/0246243 A1 | 9/2010 | Kobatake |
| 2013/0311532 A1* | 11/2013 | Olsen .................... G06F 7/483 708/491 |
| 2016/0155482 A1 | 6/2016 | La Fratta |
| 2016/0173101 A1 | 6/2016 | Gao et al. |
| 2016/0293253 A1 | 10/2016 | Ogiwara et al. |
| 2017/0003966 A1* | 1/2017 | Haraden ............ G06F 9/30043 |
| 2017/0083434 A1 | 3/2017 | Potash |
| 2017/0187397 A1* | 6/2017 | Kim .................... G06F 11/1068 |
| 2018/0358086 A1 | 12/2018 | Goel et al. |
| 2019/0065111 A1 | 2/2019 | Lea et al. |
| 2019/0066772 A1 | 2/2019 | Singh et al. |
| 2019/0115921 A1* | 4/2019 | Zhang .................... G06F 7/544 |
| 2019/0196953 A1* | 6/2019 | Gu ........................ G06F 9/3004 |
| 2019/0213289 A1* | 7/2019 | Baeckler .................... G06F 1/03 |
| 2019/0279993 A1* | 9/2019 | Madurawe ............ G11C 5/063 |
| 2019/0303749 A1 | 10/2019 | Appuswamy et al. |
| 2020/0075081 A1 | 3/2020 | Hush |
| 2020/0294580 A1 | 9/2020 | Raj et al. |
| 2021/0050040 A1 | 2/2021 | Ramesh |
| 2021/0134345 A1 | 5/2021 | Kwon et al. |
| 2021/0149984 A1 | 5/2021 | Luo |
| 2021/0349826 A1 | 11/2021 | Roy et al. |
| 2022/0019442 A1 | 1/2022 | Yudanov |
| 2022/0189531 A1 | 6/2022 | Yudanov |
| 2022/0284936 A1 | 9/2022 | Yudanov |

FOREIGN PATENT DOCUMENTS

| | | |
|---|---|---|
| CN | 105653474 | 6/2016 |
| CN | 106663459 A | 5/2017 |
| CN | 106814662 A | 6/2017 |
| CN | 107004433 A | 8/2017 |
| CN | 107408404 | 11/2017 |
| CN | 111124999 A | 5/2020 |
| CN | 111291859 A | 6/2020 |
| CN | 111724832 | 9/2020 |
| WO | 2021041654 | 3/2021 |

OTHER PUBLICATIONS

U.S. Appl. No. 16/932,524, filed Jul. 17, 2020.
USPTO, Office Action for U.S. Appl. No. 16/932,524, dated Apr. 29, 2021.
USPTO, Notice of Allowance U.S. Appl. No. 16/932,524, dated Aug. 10, 2021.
USPTO, Notice of Allowance for U.S. Appl. No. 16/932,524, dated Dec. 8, 2021.
U.S. Appl. No. 17/123,829, filed Dec. 16, 2020.
USPTO, Office Action for Application No. 17/123,829, dated Sep. 21, 2021.
USPTO, Notice of Allowance for U.S. Appl. No. 17/123,829, dated Feb. 11, 2022.
U.S. Appl. No. 17/212,551, filed Mar. 25, 2021.
USPTO, Notice of Allowance for U.S. Appl. No. 17/212,551, dated Jan. 28, 2022.
Fujita, Toru, et al., 2016 IEEE International Parallel and Distributed Processing Symposium Workshops, Department of Information Engineering, Hiroshima University, "Bitwise Parallel Bulk Computation on the GPU, with Application to the CKY Parsing for Context-free Grammars", 2016, 10 pages.
Nishimura, Takahiro, et al., IEEE Xplore, 2017 IEEE International Parallel and Distributed Processing Symposium Workshops, "Accelerating the Smith-Waterman Algorithm Using Bitwise Parallel Bulk Computation Technique on GPU", [downloaded from the internet: Mar. 25, 2021].
Wikipedia, "CYK algorithm", 7 pages, [downloaded from the internet: Mar. 25, 2021].
CN Office Action for CN Application No. 202111543795.7, dated Aug. 16, 2022, 9 pages.
USPTO, Notice of Allowance for U.S. Appl. No. 17/752,430, dated Jun. 8, 2023.
CN Office Action for CN Application No. 202110805030.X, dated Sep. 30, 2022, 9 pages.

\* cited by examiner

200

| INPUTS | | | OUTPUTS | |
|---|---|---|---|---|
| A | B | $C_{in}$ | SUM | CARRY$_{out}$ |
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

FIG. 2

RECONFIGURABLE PROCESSING-IN-MEMORY LOGIC USING LOOK-UP TABLES

REFERENCE TO RELATED APPLICATIONS

This application is a continuation of U.S. patent application Ser. No. 16/932,524 filed on Jul. 17, 2020 and issued as U.S. Pat. No. 11,403,111 on Aug. 2, 2022. The aforementioned application, and issued patent, is incorporated herein by reference, in its entirety.

TECHNICAL FIELD

Embodiments of the present disclosure are generally related to memory systems, and more specifically, are related to implementing reconfigurable processing-in-memory logic using look-up tables.

BACKGROUND

A computer system can include one or more processors (such as general purpose processors, which can also be referred to as central processing units (CPUs) and/or specialized processors, such as application-specific integrated circuits (ASICs), field programmable gate arrays (FPGAs), graphic processing units (GPUs), etc.), which are coupled to one or more memory devices and use the memory devices for storing executable instructions and data. In order to improve the throughput of the computer system, various solutions can be implemented for enabling parallelism in computations.

BRIEF DESCRIPTION OF THE DRAWINGS

The present disclosure will be understood more fully from the detailed description given below and from the accompanying drawings of some embodiments of the present disclosure.

FIG. 2 schematically illustrates an example LUT utilized for implementing a PIM computational pipeline in accordance with aspects of the present disclosure.

DETAILED DESCRIPTION

Embodiments of the present disclosure are directed to implementing reconfigurable processing-in-memory (PIM) logic using look-up tables (LUTs).

A computer system can include one or more processors (such as general purpose processors, which can also be referred to as central processing units (CPUs) and/or specialized processors, such as application-specific integrated circuits (ASICs), field programmable gate arrays (FPGAs), graphic processing units (GPUs), neural and artificial intelligence (AI) processing units (NPUs), etc.), which are coupled to one or more memory devices and use the memory devices for storing executable instructions and data. In order to improve the throughput of the computer system, various solutions can be implemented for enabling parallelism in computations. However, such solutions are often based on increasing the number of processing cores (such as GPU cores), thus increasing both the energy consumption and the overall cost of the computer system.

In order to improve the system throughput while avoiding exorbitant costs, embodiments of the present disclosure implement PIM operations by memory devices equipped with logic arrays and control blocks. The logic array can include various logic components (e.g., adders, flip-flops, etc.) which can access the LUTs stored on the memory device, thus implementing reconfigurable processing logic. The control block can manage the computations by activating certain LUTs (e.g., by activating a wordline in which a requisite row of the LUT is stored) and providing control signals to the logic array. The reconfigurable PIM logic can be utilized for implementing various computational pipelines, including highly parallel superscalar pipelines, vector pipelines, systolic arrays, hardware neural networks, and/or computational pipelines of other types, as described in more detail herein below.

Therefore, advantages of the systems and methods implemented in accordance with some embodiments of the present disclosure include, but are not limited to, providing more cost effective, with respect to various existing hardware implementations, systems and methods for implementing various computational pipelines. PIM systems implemented in accordance with embodiments of the present disclosure can be employed by embedded systems, circuit simulation or emulation systems, and various hardware accelerators, especially for algorithms requiring high degrees of parallelism. In some embodiments, PIM systems implemented in accordance with aspects of the present disclosure can outperform specialized processors (such as application-specific integrated circuits (ASICs), field programmable gate arrays (FPGAs), graphic processing units (GPUs), etc.) for applications requiring wide circuits and large amounts of memory.

Figure 1:
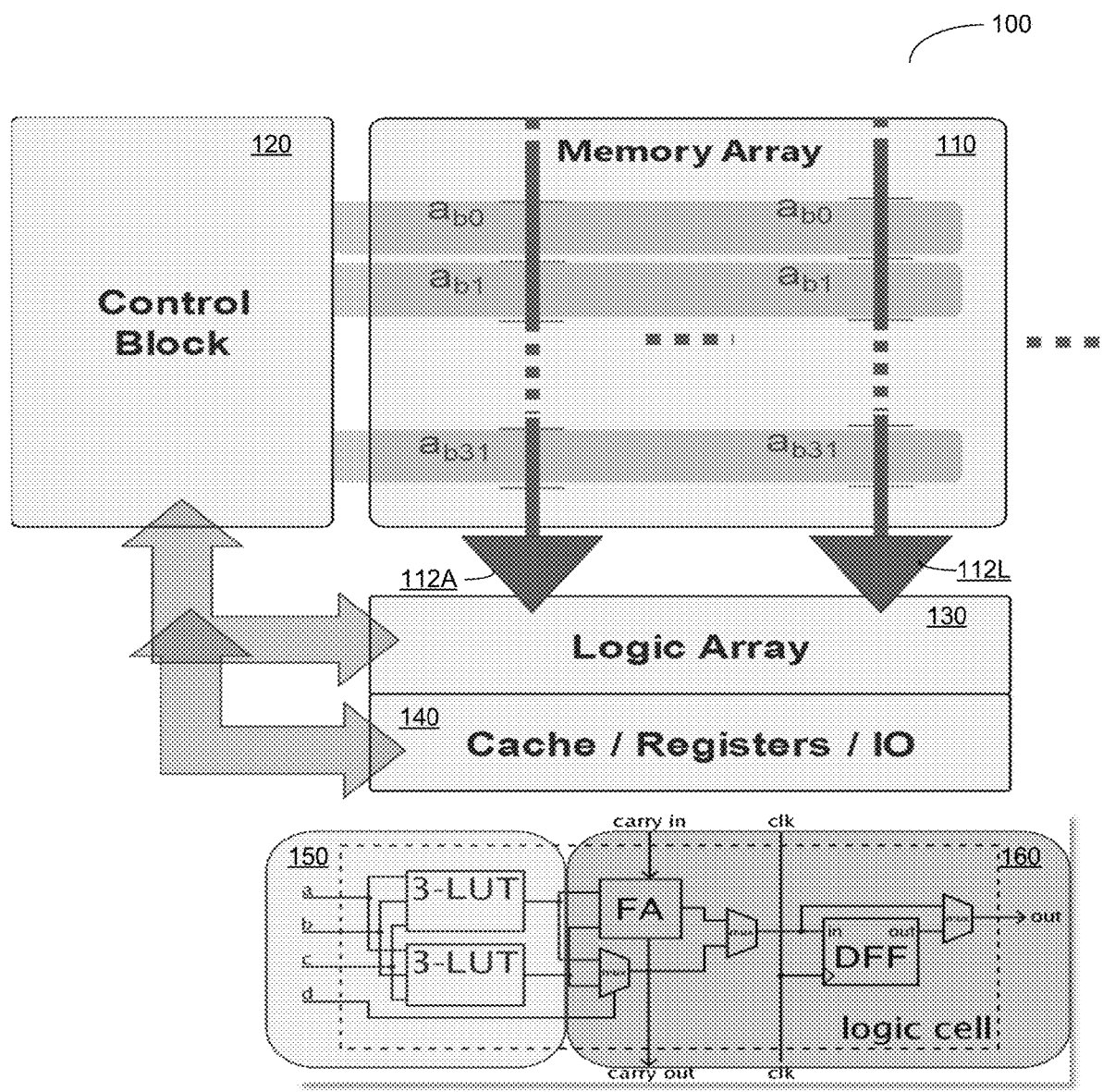
FIG. 1 illustrates a high level architectural diagram of an example processing-in-memory (PIM) module implemented in accordance with aspects of the present disclosure.

FIG. 1 illustrates a high-level architectural diagram of an example PIM system 100 implemented in accordance with aspects of the present disclosure. As shown in FIG. 1, the PIM system 100 includes the memory array 110 coupled to the control block 120, the logic array 130, and cache/registers memory 140. "Coupled to" herein refers to electrical connections between components, including indirect connections via one or more intervening components and direct connections (i.e., without intervening components).

In one embodiment, the PIM system 100 can be implemented as one or more integrated circuits located on a single chip. In another embodiment, the PIM system 100 can be implemented as a System-on-Chip, which, in addition to the components shown in FIG. 1, can include one or more processing cores and one or more input/output (I/O) interfaces. In some embodiments, the PIM system 100 can include various other components, which are omitted from FIG. 1 for clarity and conciseness.

The memory array 110 can be provided by a dynamic random-access memory (DRAM) array, which is a matrix of memory cells addressable by rows (wordlines) and columns (bitlines). Each memory cell includes a capacitor that holds the electric charge and a transistor that acts as a switch controlling access to the capacitor.

In another embodiment, the memory array 110 can be provided by resistive random-access memory (ReRAM) including but not limited to 3D X-point memory, which is a matrix of memory cells addressable by rows (wordlines) and columns (bitlines), including embodiments where rows and columns are symmetric (a row can play a role of column and a column can play a role of row). Each memory cell includes a resistive memory cell that holds its conductivity or resistivity state.

In another embodiment, the memory array 110 can be provided by Flash memory including but not 3D NAND Flash storage, which is a 3D matrix of memory cells addressable by planes (wordlines) and NAND strings (bitlines). Each memory cell includes a Flash transistor with a floating gate that holds its threshold voltage state (Vt) depending on the charge stored in a floating gate of the transistor.

In another embodiment, the memory array 110 can be provided by non-volatile hybrid FeRAM-DRAM memory (HRAM) array, which is a matrix of memory cells addressable by rows (wordlines) and columns (bitlines). Each memory cell includes a ferroelectric capacitor that holds the electric charge and a transistor that acts as a switch controlling access to the ferroelectric capacitor.

The memory array 110 can be employed for storing the LUTs and data utilized for the computations, as well as the computation results. Each LUT can implement an arithmetic or logic operation by storing one or more logic operation results in association with a look-up address comprising one or more logic operation inputs. In some embodiments, the PIM system 100 can further include a plurality of sense amplifiers 112A-112L coupled to the memory array. A sense amplifier can be employed to sense, from a selected bitline, a low power signal encoding the content of the memory cell and amplify the sensed signal to a recognizable logical voltage level.

The cache/registers memory 140 can be implemented by a static random access memory (SRAM) array or by low-latency magnetoresistive random-access memory, including but not limited to magnetic tunnel junction (MTJ) memory cells. Cache/registers memory 140 can be employed for caching a subset of the information stored in the memory array 110. The SRAM array 140 can include multiple cache lines that can be employed for storing copies of the most recently and/or most frequency accessed data items residing in the memory array 110. In various illustrative examples, the cache can be utilized to store copies of one or more LUTs to be utilized by the computational pipeline that is currently being executed by the control block 120, intermediate results produced by intermediate stages of the computational pipeline, and/or signals of the logic array 130. At least part of the SRAM array 140 can be allocated for registers, which store values of frequently updated memory variables utilized for computations.

The logic array 130 can include various logic components, such as full adders, half adders, multipliers, D-type flip-flops, and/or other components for implementing logic operations. Example logic operations are schematically shown as the functional block 150. The logic operations can implement reconfigurable processing logic by performing the logic operations on the LUTs (schematically shown as the function block 160) as they are activated by the control block 120 and/or on other data stored in the memory array 110 and/or in the cache/registers memory 140. Furthermore, the logic cells within the logic array 130 can exchange data amongst themselves. The logic operations performed by the logic array 130 can include, e.g., binary and bitwise disjunction (OR), conjunction (AND), exclusive disjunction (XOR), addition (ADD), etc. In some embodiments, the logic array 130 can be implemented as a high-speed fabric interconnect with programmable flexible topology (e.g., cross-bar) and with included logic cells that can be programmed with data from the LUTs. In such embodiments, the LUT-based logic can perform much faster and can have much more flexible data exchange compared to PIM embodiments based on row buffer implementations.

As noted herein above, the memory array 110 can store multiple LUTs implementing various logic operations. The LUTs necessary for implementing a particular computational pipeline can be copied to the cache 140, such that the logic array 130 would be able to access the LUTs residing in the cache 140 without accessing the memory array 110. In some cases, the LUTs can be programmed to logic array 130 directly.

The logic array 130 can receive the inputs from the control block 120 and/or from the memory array 110, because the memory array 110 may, besides the LUTs, store the data utilized for the computations. In other words, the memory array 110 can store both the data to perform the computations on, as well as the LUTs implementing the computational logic. The control block 120 can process executable instructions (sequentially or in parallel), which can be stored in the memory array 110, thus implementing a von Neumann architecture in a manner that is conceptually similar to a regular computational pipeline (e.g. CPU or GPU pipeline): instruction fetch, decode, configure, and execute. Configuring an instruction can involve activating, by the control block 120, the wordlines storing the LUTs and the data. Executing the instruction(s) involves retrieving, by the logic array 130, the contents stored in the activated wordlines and performing, on the retrieved data, the logic operations specified by the control signals supplied by the control block 120. The result of the computations can be stored in the memory array 110 and/or outputted via an input/output (I/O) interface coupled to the memory (not shown in FIG. 1 for clarity and conciseness). Thus, the control block 120 can implement a computational pipeline by activating certain LUTs (e.g., by activating a memory array wordline in which a requisite row of the LUT is stored), thus making the LUTs available to the logic array 130.

The wordline drivers of the control block 120 that activate specific wordlines can reside on the same die with the memory array. In some embodiments, the processing core of the control block 120 can be also located on the same die, thus implementing a system-on-chip. Alternatively, the processing code can be located on a different die, as long as a physical connection providing a sufficient bandwidth and throughput between the processing core and the memory array is available. In some embodiments, the control block can be implemented by an external processing core, such as a dedicated core of a CPU, which is controlled by a software driver.

In some embodiments, the control block 120 can receive its instructions for execution from the memory array 110 either via the logic array 130 or wordlines of memory array 110. The latter is possible if the memory array 110 is provided by resistive random-access memory (ReRAM), which is a matrix of memory cells addressable by rows (wordlines) and columns (bitlines), where rows and columns are symmetric (i.e., a row can play a role of a column and a column can play a role of a row). In this case, the sense amplifiers/drivers of logic array 130 provide sufficient driving strength via bitlines in order for sense amplifiers/drivers of the control block 120 to sense data.

Furthermore, due to symmetricity of data access, the functions of logic array 130 and control block 120 can in some embodiments be merged such that control block 120 in FIG. 1 can also implement functions of logic array 130, and logic array 130 in FIG. 1 can also implement functions of control block 120. As a result, such embodiments may have symmetric two blocks per array (connected to the memory array 110 from the left and bottom of the memory array 110). Furthermore, in some embodiments, the two blocks can be further expanded to four symmetrical blocks (connected to the memory array 110 from left, right, bottom, and top of the memory array 110).

In some embodiments, the PIM system can be implemented as a layered or stacked chip, in which the memory array 110 and the control block 120 are located within two different layers of the same die.

FIG. 2 schematically illustrates an example LUT utilized for implementing a PIM computational pipeline in accordance with aspects of the present disclosure. As shown in FIG. 2, LUT 200 implementing the add-with-carry operation of three bit inputs A, B, C (full adder). The LUT 200 has one column for each of the operands A, B, C, and two columns for the results: one column for the single-bit sum of the operands, and one column for the carry bit. Accordingly, each line of the LUT includes a combination of the operands A, B, C, and the corresponding values of the single-bit sum and the carry bit. Various other arithmetic and logic operations can be implemented in a similar manner, by storing in the memory array their respective truth tables in a form of a LUT. A truth table stores at least a subset of all possible combinations of the operation arguments (operands) together with the corresponding operation results. The control block 120 can, at every stage of the computational pipeline, select, from the LUT, the row which corresponds to the current values of the bit inputs. The control block 120 further can activate the wordline that is identified by a sum of the base address of the LUT and the offset of the requisite row in the LUT with respect to its based address.

In some embodiments, the LUTs can be cached in cache 140 by interleaving the computations performed by logic array 130 with memory accesses (e.g. while the logic array 130 performs computations on one part of LUTs, another part of the LUT can be read from the memory array 110 and stored in the cache 140). The computation results from the cache 140 can be stored to memory array 110 in a similar manner.

In some embodiments, the processing logic implemented by the logic array and the LUTs can re-write itself based on conditions detected in the logic, data, and results. Such intelligent logic can be part of an AI training engine or a fuzzy logic. In some cases, such logic may need to perform checkpoints so to always have a good known state of itself for a possible roll-back from an erroneous state.

Figure 3:
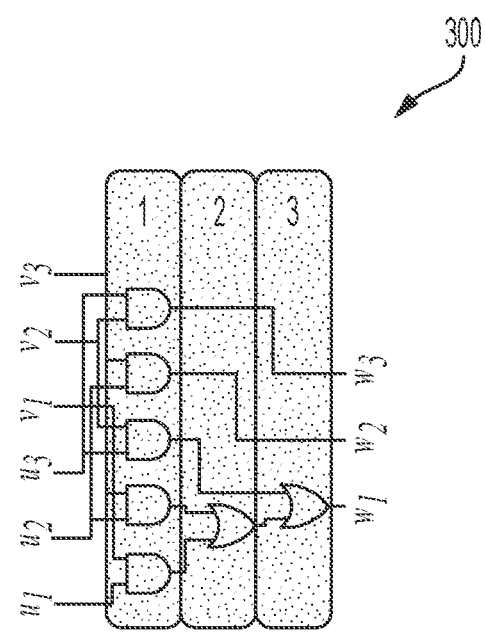
FIG. 3 schematically illustrates a simplified example of a computational pipeline implemented by a PIM system operating in accordance with aspects of the present disclosure.

FIG. 3 schematically illustrates a simplified example of a computational pipeline implemented by a PIM system operating in accordance with aspects of the present disclosure. As schematically illustrated by FIG. 3, the example computational pipeline 300 includes instructions 1-3, such that instruction 1 implements multiple concurrent logical operations on a set of inputs $u_1$-$u_3$ and $v_1$-$v_3$, instruction 2 implements further concurrent logical operations on the intermediate results produced by instruction 1, and instruction 3 implements further concurrent logical operations on the intermediate results produced by instructions 1 and 2, thus producing a set of outputs $w_1$-$w_3$.

While FIG. 3 illustrates a simplified pipeline example, PIM systems operating in accordance with aspects of the present disclosure can be employed for implementing various other pipelines, examples of which are described in more detail herein below. In addition, FIG. 3 illustrates how the processing logic can be broken down into three sequential operations. In other implementations, the processing logic can be broken down into more or fewer sequential operations depending on the computational capabilities and programmability of the logic array 130.

Figure 4:
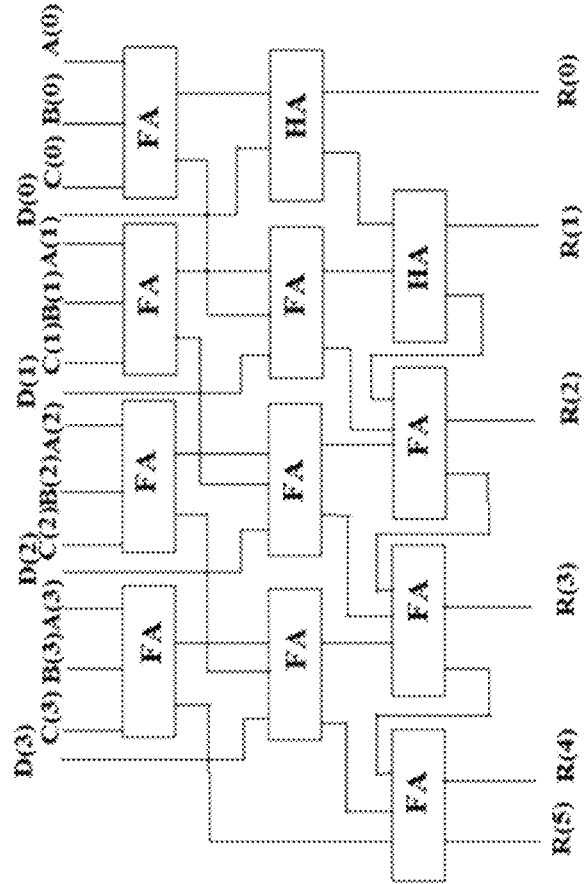
FIG. 4 schematically illustrates an example of a parallel adder pipeline implemented by a PIM system operating in accordance with aspects of the present disclosure.

FIG. 4 schematically illustrates an example of a parallel adder pipeline 400 implemented by a PIM system operating in accordance with aspects of the present disclosure. The computational pipeline 400 can implement a multi-bit parallel adder (such as a Brent Klung adder). As shown in FIG. 4, the computational pipeline 400 can include multiple full adders (FAs), each of which is implemented by a respective LUT (e.g., implementing the truth table 200 of FIG. 2) residing in the memory array 110. Thus, the computational pipeline can be initiated by copying to the cache 140 the LUTs implementing the full adders. Then, the data can be fetched from the memory array 110 or provided from an external interface via an input/output (I/O) link. Each of the full adders would produce two results: the sum and the carry. These results would be supplied to the next stage of the computational pipeline, which involves processing the output of the previous pipeline stage by a set of adders. Thus, at each stage of the computational pipeline, each of the adders would receive its inputs from the previous pipeline stage (or from the memory array 110 or I/O in case of the first pipeline stage), and would supply its outputs to the next pipeline stage (or to the memory array 110 and/or an I/O interface in case of the last pipeline stage). In some implementations, an optional fabric interconnect embedded into the logic array 130 can facilitate flexible data exchange among different logic elements of the logic array 130 when transitioning from one pipeline stage to another.

While the illustrative example of FIG. 4 utilizes adders, PIM systems operating in accordance with aspects of the present disclosure can implement computational pipelines utilizing other logic elements, such as multipliers.

In some embodiments, the control block 120 can implement a simple reduced instruction set computer (RISC) pipeline with no speculation and no instruction-level parallelism. In other embodiments, the control block 120 can implement at least some instruction-level parallelism and out-of-order execution, thus implementing Tomasulo or scoreboarding-type computational pipelines (i.e., complex instruction set computer (CISC) pipelines).

In some embodiments, the control block 120 can implement a Single Instruction Multiple Data (SIMD) computational pipeline, by employing multiple processing elements that simultaneously perform the same operation on multiple data items simultaneously, as described in more detail herein below. Such embodiments can implement very efficient solutions for matrix multiplication and dot-product operations. A SIMD-style pipeline can be RISC or CISC type. Furthermore, a SIMD pipeline can be implemented as a very long instruction word (VLIW) pipeline for exploiting more instruction-level parallelism.

In some embodiments, the control block 120 can implement a two-dimensional pipeline, such as a systolic array, which is a collection of processing elements arranged in a two-dimensional grid (or higher-dimensional grid in some cases). Each processing element in a systolic array implements a logical function and stores and forwards data to other elements, as described in more detail herein below. Thus, a systolic array produces $A^B$ operations in a single clock cycle, where A is an array width and B is the number of dimensions.

Figure 5:
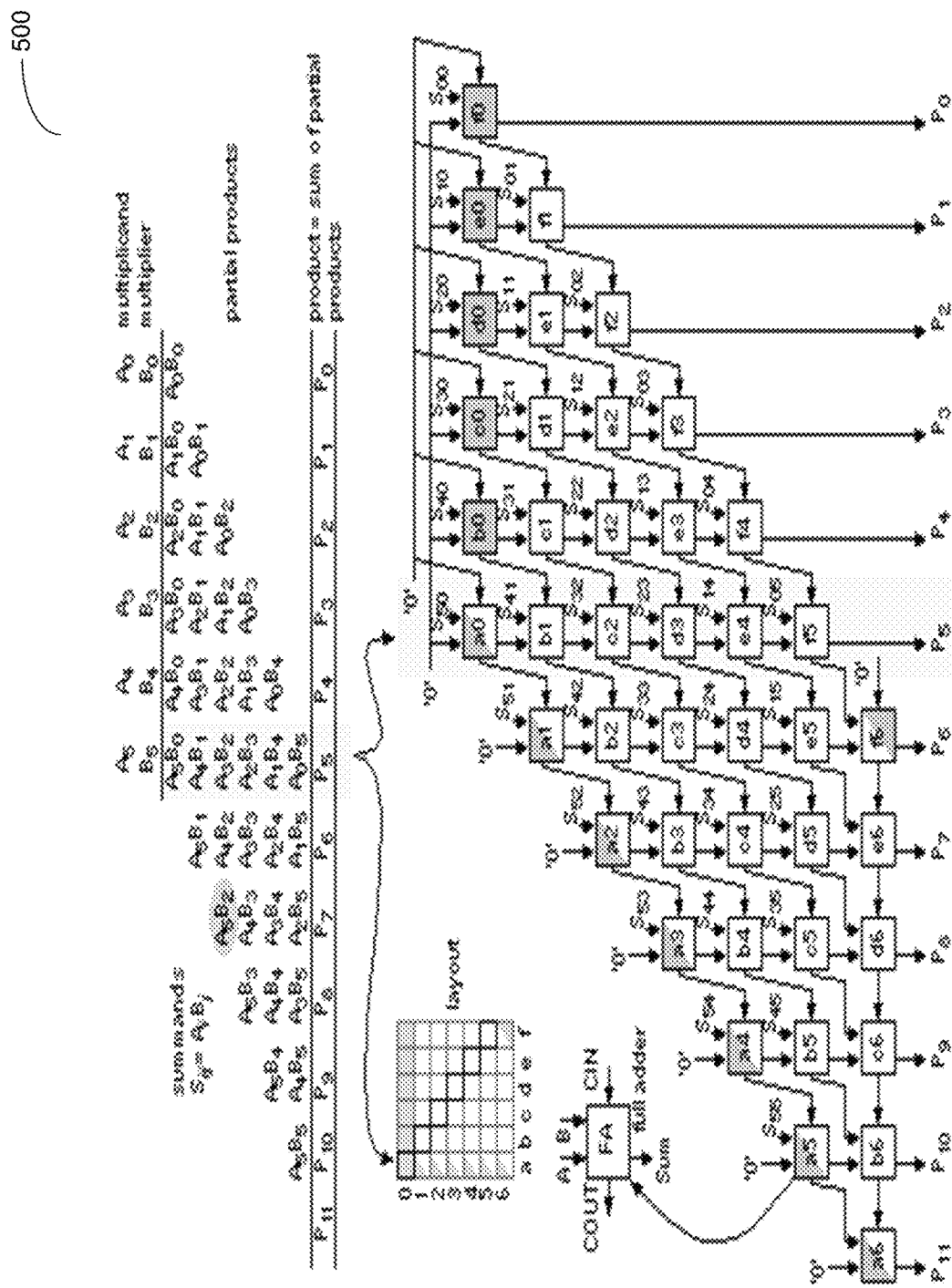
FIG. 5 schematically illustrates an example of parallel multiplication pipeline implemented by a PIM system operating in accordance with aspects of the present disclosure.

FIG. 5 schematically illustrates an example of parallel multiplication pipeline 500 implemented by a PIM system operating in accordance with aspects of the present disclosure. The computational pipeline 500 can implement the multiplication operation with respect to multiplicand $A_0$-$A_5$ and multiplier $B_0$-$B_5$. As shown in FIG. 5, the computational pipeline 500 can include multiple full adders (FAs), each of which is implemented by a respective LUT (e.g., implementing the truth table 200 of FIG. 2) residing in the memory array 110. Thus, the computational pipeline can be initiated by copying to the cache 140 one or more LUTs implementing the full adders. In some embodiments, a LUT can be replicated within cache 140 according to instructions conveyed by the control block 120. Then, the data can be fetched from the memory array 110 or from I/O links. Each of the full adders would produce two results: the sum and the carry. These results would be supplied to the next stage of the computational pipeline (which can be implemented, e.g., by same full adders but having different inputs), which involves processing the output of the previous pipeline stage by a set of adders. Thus, at each stage of the computational pipeline, each of the adders would receive its inputs from the previous pipeline stage (or from the memory array 110 or from I/O links in case of the first pipeline stage), and would supply its outputs to the next pipeline stage (or to the memory array 110 and/or an I/O interface in case of the last pipeline stage). After the last stage, the multiplier 500 outputs the product $P_0$-$P_{11}$.

Figure 6:
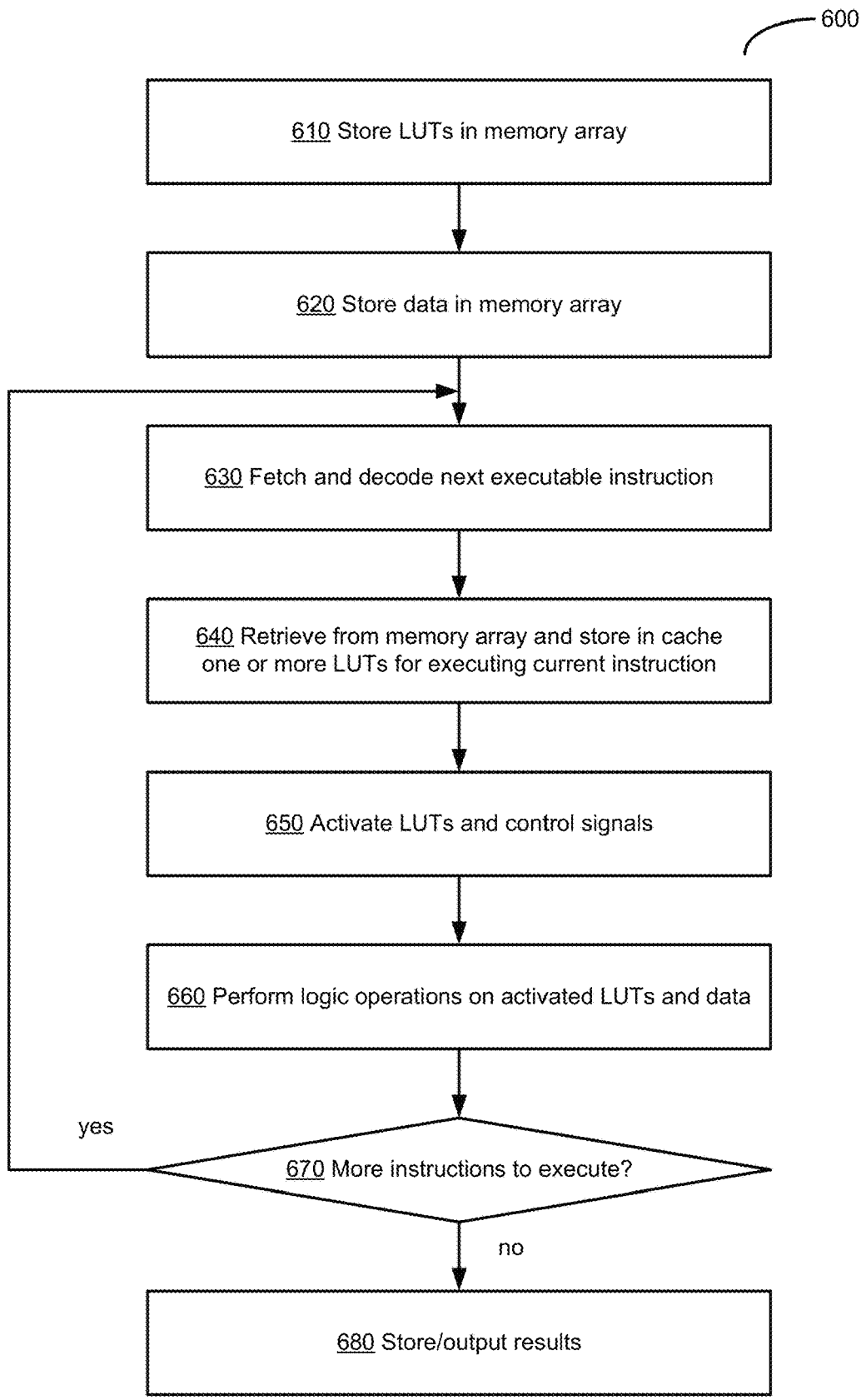
FIG. 6 is a flow diagram of an example method of implementing a computational pipeline by a PIM system operating in accordance with some embodiments of the present disclosure

FIG. 6 is a flow diagram of an example method 600 of implementing a computational pipeline by a PIM system operating in accordance with some embodiments of the present disclosure. As noted herein above, the PIM system can include a memory array coupled to a control block, a logic array, and cache/registers memory. The computational pipeline can be specified by a sequence of executable instructions stored in the memory array or received via an I/O link.

In some embodiments, the method 600 is performed by the PIM system 100 of FIG. 1. Although the operations of the method are shown in a particular sequence or order, the order of the operations can, unless otherwise specified, be modified. Thus, the illustrated embodiments should be understood only as examples, and the illustrated operations can be performed in a different order, while some operations can be performed in parallel. Additionally, in some embodiments, one or more operations can be omitted or more operations can be inserted. Thus, not all illustrated operations are required in every embodiment, and other process flows are possible.

At operation 610, the PIM system implementing the method stores in the memory array a plurality of look-up tables (LUTs) implementing various logical and/or arithmetic operations.

At operation 620, the PIM system stores in the memory array the data to be utilized for computations (e.g., the initial values to be supplied to the first executable instruction of the computational pipeline). In some embodiments, the data can be received directly from I/O links.

At operation 630, the control block fetches from the memory array (or from the cache) the next executable instruction and decodes the fetched instruction in order to determine the operation to be performed and its operands. In some embodiments, the instructions can be fetched directly from IO links.

At operation 640, the control block of the PIM retrieves from the memory array and stores in the cache one or more LUTs to be utilized for executing the current instruction. In some embodiments, executing the current instruction can be overlapped with retrieving data or LUTs for the next instruction.

At operation 650, the control block of the PIM activates one or more LUTs to be utilized for the current executable instruction of the computational pipeline. The control block can further produce one or more control signals selecting one or more elements of the logic array utilized for the current executable instruction of the computational pipeline. In an illustrative example, the control block can, for each LUT activate a wordline in which a row of the LUT is stored that is identified by a combination of the inputs, as described in more detail herein above.

At operation 660, the logic array of the PIM performs, based on control inputs received from the control block, logic operations on the activated LUTs and the data.

Responsive to determining, at operation 670, that the computational pipeline includes further executable instructions, the method can loop back to operation 630. Otherwise, at operation 680, the results produced by the computational pipeline are stored in the memory array and/or outputted via an I/O interface, and the method terminates. In some embodiments, the continuous output without termination is possible (e.g., implemented by a 'while true' loop).

Figure 7:
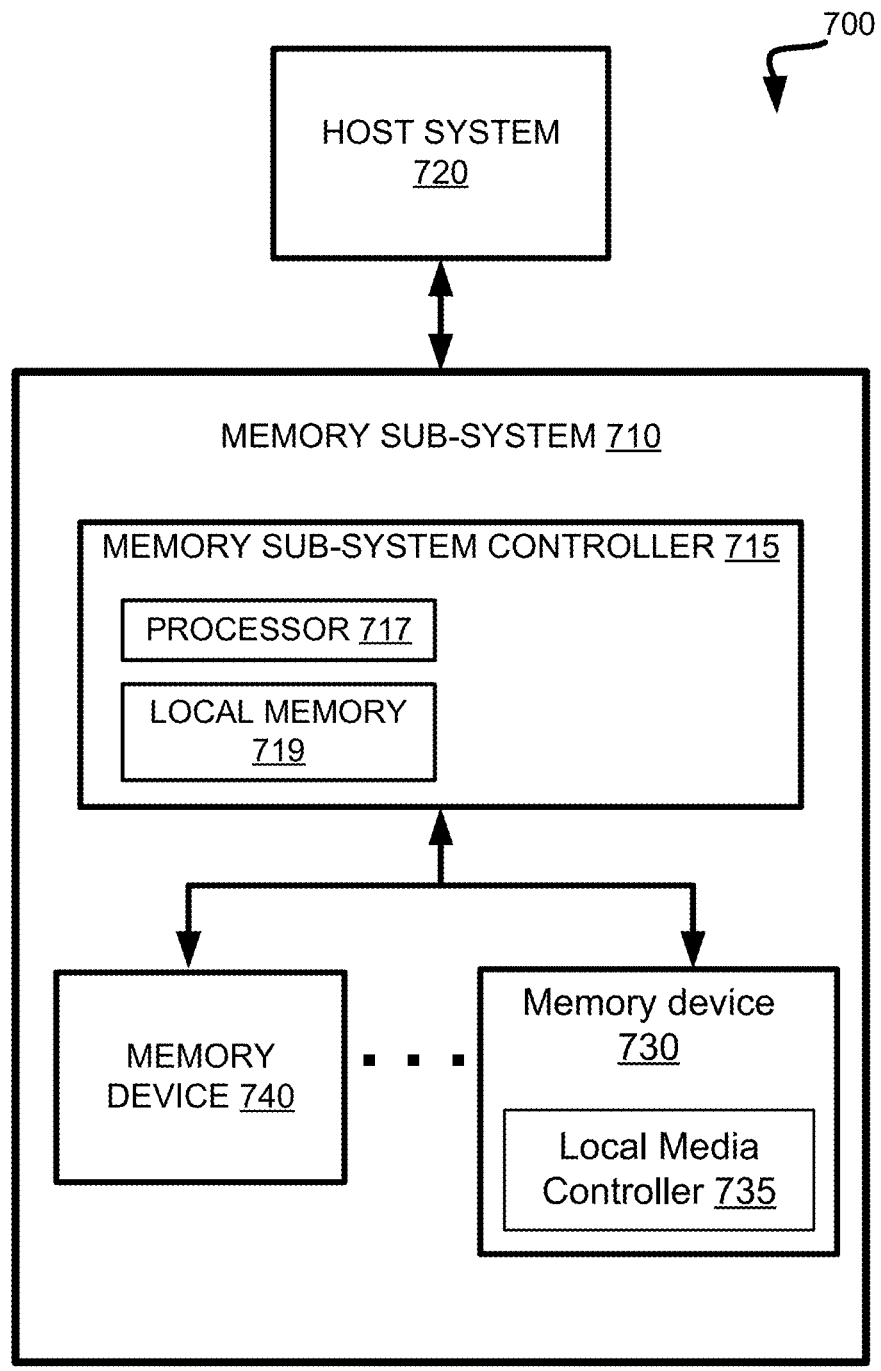
FIG. 7 illustrates an example computing system that includes a memory sub-system implemented in accordance with some embodiments of the present disclosure.

FIG. 7 illustrates an example computing system 700 that includes a memory sub-system 710 implemented in accordance with some embodiments of the present disclosure. The memory sub-system 710 can include media, such as one or more volatile memory devices (e.g., memory device 740), one or more non-volatile memory devices (e.g., memory device 730), or a combination of such. In some embodiments, one or more memory devices 740 can be utilized for implementing PIM systems operating in accordance with one or more aspects of the present disclosure. Accordingly, one or more memory devices 740 can each include a memory array coupled to a control block, a logic array, and cache/registers memory, as described in more detail herein above with references to FIG. 1.

The memory sub-system 710 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 700 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 700 can include a host system 720 that is coupled to one or more memory sub-systems 710. In some embodiments, the host system 720 is coupled to different types of memory sub-systems 710. FIG. 7 illustrates one example of a host system 720 coupled to one memory sub-system 710. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 720 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 720 uses the memory sub-system 710, for example, to write data to the memory sub-system 710 and read data from the memory sub-system 710.

The host system 720 can be coupled to the memory sub-system 710 via a physical host interface. Examples of a physical host interface include, but are not limited to, a serial advanced technology attachment (SATA) interface, a peripheral component interconnect express (PCIe) interface, CXL interface, CCIX interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), etc. The physical host interface can be used to transmit data between the host system 720 and the memory sub-system 710. The host system 720 can further utilize an NVM Express (NVMe) interface to access components (e.g., memory devices 730) when the memory sub-system 710 is coupled with the host system 720 by the PCIe interface 105. The physical host interface 105 can provide an interface for passing control, address, data, and other signals between the memory sub-system 710 and the host system 720. FIG. 7 illustrates a memory sub-system 710 as an example. In general, the host system 720 can access multiple memory sub-systems via a same communication connection, multiple separate communication connections, and/or a combination of communication connections.

In some embodiments, a dedicated processing core of a CPU of the host system 720 can be controlled by a software driver to implement the functions of the PIM control block 120 of FIG. 1, as described in more detail herein above.

The memory devices 730, 740 can include any combination of the different types of non-volatile memory devices and/or volatile memory devices. The volatile memory devices (e.g., memory device 740) can be, but are not limited to, random access memory (RAM), such as dynamic random access memory (DRAM) and synchronous dynamic random access memory (SDRAM).

Some examples of non-volatile memory devices (e.g., memory device 730) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 730 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 730 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 730 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type memory (e.g., 2D NAND, 3D NAND) are described, the memory device 730 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 775 can communicate with the memory devices 730 to perform operations such as reading data, writing data, or erasing data at the memory devices 730 and other such operations. The memory sub-system controller 775 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 775 can be a microcontroller, special purpose logic circuitry (e.g., a field programmable gate array (FPGA), an application specific integrated circuit (ASIC), etc.), or other suitable processor.

The memory sub-system controller 775 can include a processor 717 (e.g., a processing device) configured to execute instructions stored in a local memory 719. In the illustrated example, the local memory 719 of the memory sub-system controller 775 includes an embedded memory configured to store instructions for performing various processes, operations, logic flows, and routines that control operation of the memory sub-system 710, including handling communications between the memory sub-system 710 and the host system 720. In some embodiments, the processor 717 can be controlled by a software driver to implement the functions of the PIM control block 120 of FIG. 1, as described in more detail herein above.

In some embodiments, the local memory 719 can include memory registers storing memory pointers, fetched data, etc. The local memory 719 can also include read-only memory (ROM) for storing micro-code. While the example memory sub-system 710 in FIG. 7 has been illustrated as including the controller 775, in another embodiment of the present disclosure, a memory sub-system 710 does not include a controller 775, and can instead rely upon external control (e.g., provided by an external host, or by a processor or controller separate from the memory sub-system).

In general, the memory sub-system controller 775 can receive commands or operations from the host system 720 and can convert the commands or operations into instructions or appropriate commands to achieve the desired access to the memory devices 730. The memory sub-system controller 775 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 730. The memory sub-system controller 775 can further include host interface circuitry to communicate with the host system 720 via the physical host interface. The host interface circuitry can convert the commands received from the host system into command instructions to access the memory devices 730 as well as convert responses associated with the memory devices 730 into information for the host system 720.

The memory sub-system 710 can also include additional circuitry or components that are not illustrated. In some embodiments, the memory sub-system 710 can include a cache or buffer (e.g., DRAM) and address circuitry (e.g., a row decoder and a column decoder) that can receive an address from the controller 775 and decode the address to access the memory devices 730.

In some embodiments, the memory devices 730 include local media controllers 735 that operate in conjunction with memory sub-system controller 775 to execute operations on one or more memory cells of the memory devices 730. An external controller (e.g., memory sub-system controller 775) can externally manage the memory device 730 (e.g., perform media management operations on the memory device 730). In some embodiments, memory sub-system 710 is a managed memory device, which is a raw memory device 730 having control logic (e.g., local media controller 735) on the die and a controller (e.g., memory sub-system controller 775) for media management within the same memory device package. An example of a managed memory device is a managed NAND (MNAND) device.

Figure 8:
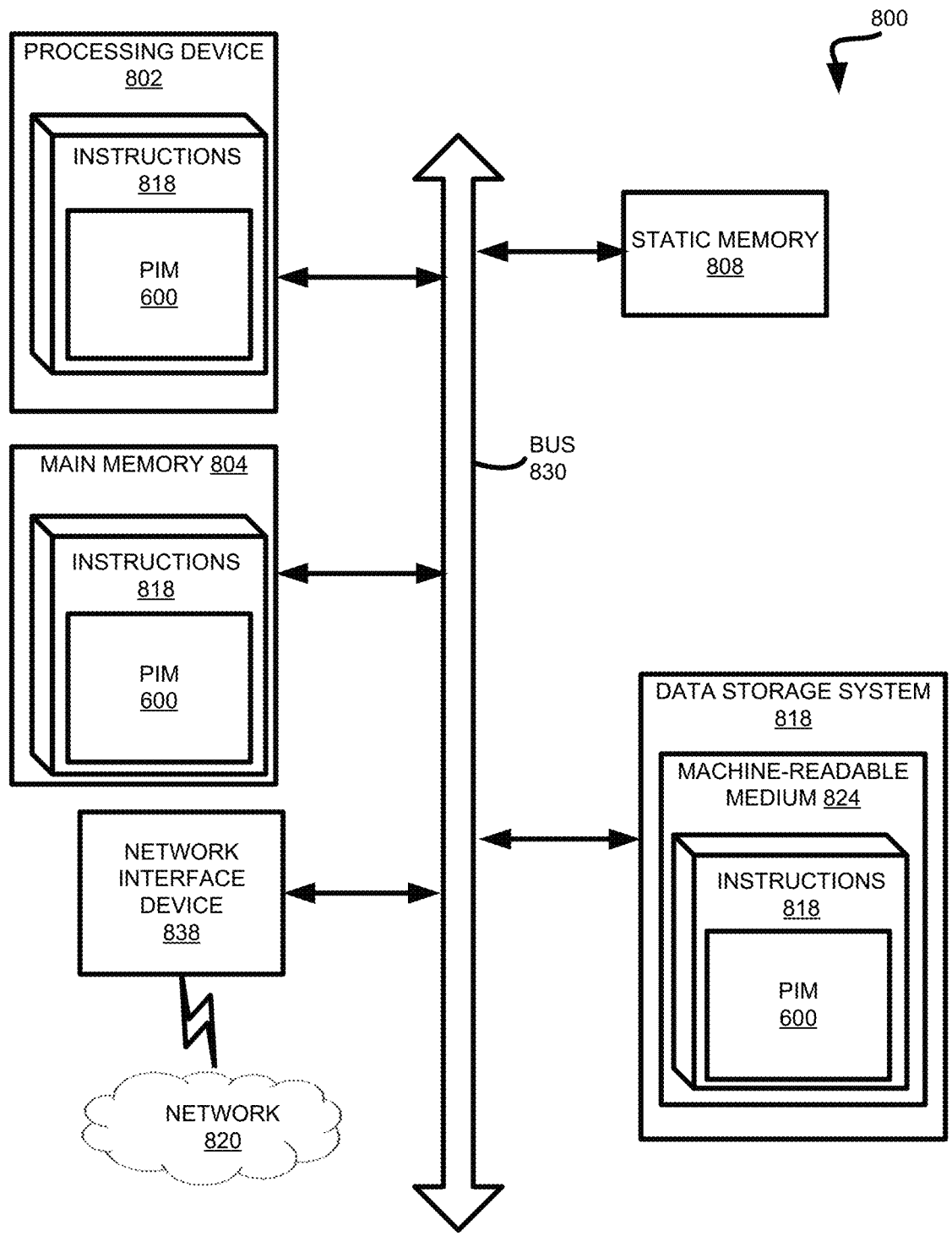
FIG. 8 is a block diagram of an example computer system in which embodiments of the present disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 7) that includes, is coupled to, or utilizes a memory sub-system (e.g., the memory sub-system 110 of FIG. 7) or can be used to perform the operations of a controller (e.g., to execute an operating system to perform operations corresponding to the host event notification component 113 of FIG. 7).

In alternative embodiments, the machine can be connected (e.g., a network interface device 838 coupled to the network 820) to other computer system in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 808 (e.g., flash memory, static random access memory (SRAM), etc.), and a data storage system 818, which communicate with each other via a bus 830.

Processing device 802 represents one or more general-purpose processing devices such as a microprocessor, a CPU, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 828 for performing the operations and steps discussed herein. In some embodiments, a dedicated processing core of a CPU 802 can be controlled by a software driver to implement the functions of the PIM control block 120 of FIG. 1. In an illustrative example, the software driver can implement the example method 600, as described in more detail herein above.

The data storage system 818 can include a machine-readable storage medium 824 (also known as a computer-readable medium) on which is stored one or more sets of instructions 828 or software embodying any one or more of the methodologies or functions described herein. The instructions 828 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 7.

In one embodiment, the instructions 828 include instructions to implement the example method 600 of implementing a computational pipeline by a PIM system operating in accordance with some embodiments of the present disclosure. While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the present disclosure have been described with reference to specific example embodiments thereof. It will be evident that various modifications can be made thereto without departing from the broader spirit and scope of embodiments of the present disclosure as set forth in the following claims. The specification and drawings are, accordingly, to be regarded in an illustrative sense rather than a restrictive sense.

What is claimed is:

1. A system, comprising:
   a memory array to store a plurality of look-up tables (LUTs) and data, wherein a LUT of the plurality of LUTs implements a logic operation by storing a logic operation result in association with a look-up address comprising one or more logic operation inputs;
   a control block coupled to the memory array, the control block to control a computational pipeline by activating one or more LUTs of the plurality of LUTs; and
   a logic array coupled to the memory array and the control block, the logic array to perform, based on control inputs received from the control block, logic operations on the activated LUTs and the data.

2. The system of claim 1, further comprising a cache coupled to the memory array and to the logic array, wherein the cache is utilized to store one or more LUTs of the plurality of LUTs.

3. The system of claim 1, wherein the logic array comprises at least one of: a full adder, a half adder, a multiplier, or a D-type flip-flop.

4. The system of claim 1, wherein the look-up address identifies a wordline of the memory array.

5. The system of claim 1, wherein the control block controls the logic array and the plurality of LUTs to implement a single instruction multiple data (SIMD) computational pipeline.

6. The system of claim 1, wherein the control block controls the logic array and the plurality of LUTs to implement a very large instruction word (VLIW) computational pipeline.

7. The system of claim 1, wherein the control block controls the logic array and the plurality of LUTs to implement a scalar computational pipeline.

8. The system of claim 1, wherein the control block sequentially executes a set of executable instructions stored in the memory array.

9. A system-on-chip (SoC), comprising:
   a memory array to store a plurality of look-up tables (LUTs) and data, wherein one or more LUTs of the plurality of LUTs implement one or more logic operations by storing one or more logic operation results in association with a look-up address comprising one or more logic operation inputs;
   one or more logic arrays coupled to the memory array, the one or more logic arrays to:
      control a computational pipeline by activating one or more LUTs of the plurality of LUTs; and
      perform logic operations on the activated LUTs and the data.

10. The SoC of claim 9, further comprising a plurality of sense amplifiers coupled to the memory array.

11. The SoC of claim 9, further comprising a cache coupled to the memory array and to the one or more logic arrays, wherein the cache is utilized to store one or more LUTs of the plurality of LUTs.

12. The SoC of claim 9, wherein the one or more logic arrays are further to:
    receive executable instructions from the memory array.

13. A method, comprising:
storing, in a memory array, a plurality of look-up tables (LUTs) and data, wherein one or more LUTs of the plurality of LUTs implement one or more logic operations by storing one or more logic operation results in association with a look-up address comprising one or more logic operation inputs;
activating, by a control block coupled to the memory array, one or more LUTs of the plurality of LUTs; and
performing, by a logic array coupled to the control bock and to the memory array, based on control inputs received from the control block, logic operations on the activated LUTs and the data.

14. The method of claim 13, further comprising:
storing, in a cache coupled to the memory array and to the logic array, at least one LUT of the plurality of LUTs.

15. The method of claim 13, wherein the logic array comprises at least one of: a full adder, a half adder, a multiplier, or a D-type flip-flop.

16. The method of claim 13, wherein activating the LUTs is performed responsive to executing an instruction of a set of executable instructions stored in the memory array.

17. The SoC of claim 9, wherein the control block controls the logic array and the plurality of LUTs to implement one of: a single instruction multiple data (SIMD) computational pipeline, a very large instruction word (VLIW) computational pipeline, or a scalar computational pipeline.

18. The SoC of claim 9, wherein the look-up address identifies a wordline of the memory array.

19. The method of claim 13, further comprising:
implementing, by the control block controlling the logic array and the plurality of LUTs, one of: a single instruction multiple data (SIMD) computational pipeline, a very large instruction word (VLIW) computational pipeline, or a scalar computational pipeline.

20. The method of claim 13, wherein the look-up address identifies a wordline of the memory array.

* * * * *